United States Patent
Costa

(10) Patent No.: US 7,948,258 B2
(45) Date of Patent: May 24, 2011

(54) SEMICONDUCTOR ARRANGEMENT AND METHOD FOR THE MEASUREMENT OF A RESISTANCE

(75) Inventor: Alexander Costa, Graz (AT)

(73) Assignee: austriamicrosystems AG, Unterpremstätten (AT)

( * ) Notice: Subject to any disclaimer, the term of this patent is extended or adjusted under 35 U.S.C. 154(b) by 99 days.

(21) Appl. No.: 12/406,721

(22) Filed: Mar. 18, 2009

(65) Prior Publication Data

US 2009/0237105 A1 Sep. 24, 2009

(30) Foreign Application Priority Data

Mar. 18, 2008 (DE) .......................... 10 2008 014 774

(51) Int. Cl.
*G01R 31/26* (2006.01)
(52) U.S. Cl. ................ 324/762.01; 324/762.02; 257/48; 257/E23.021
(58) Field of Classification Search .................. None
See application file for complete search history.

(56) References Cited

U.S. PATENT DOCUMENTS

| | | | |
|---|---|---|---|
| 5,760,600 A * | 6/1998 | Kasai | ........................... 324/769 |
| 6,018,462 A | 1/2000 | Sakuyama | |
| 6,700,399 B1 * | 3/2004 | Savithri | ........................ 324/765 |
| 6,853,078 B2 | 2/2005 | Yamaya et al. | |
| 7,521,809 B2 * | 4/2009 | Birzer et al. | .................. 257/777 |

FOREIGN PATENT DOCUMENTS

| | | |
|---|---|---|
| DE | 10 2004 005 586 | 9/2005 |
| JP | 4-373145 | 12/1992 |
| WO | WO 2006/058019 | 6/2006 |

* cited by examiner

*Primary Examiner* — Minh N Tang
(74) *Attorney, Agent, or Firm* — Cohen Pontani Lieberman & Pavane LLP

(57) ABSTRACT

A semiconductor arrangement has a semiconductor body (CP), comprising a semiconductor layer (HL) with a first (AB11, AB12) and at least one second (AB21, AB22) conducting terminal areas, respectively made in two parts, and with a first (TAB1) and a second (TAB2) test terminals; a first (KI1, KU1) and at least one second (KI2, KU2) contact areas, located on the semiconductor body (CP) and made of two parts, which are connected with the respective terminal areas (AB11, AB12; AB21, AB22), and a first (TK1) and a second (TK2) test contact areas that are connected with the respective test terminal areas (TAB1, TAB2); a first terminal (10) that can be arranged on the semiconductor body (CP) and that contacts both parts of the two-part first contact areas (KI1, KU1), and at least one second terminal (20) that can be placed on the semiconductor body (CP) and that contacts both parts of the at least one second two-part contact area (KI2, KU2), and a first (30) and a second (40) test terminals, which can be arranged on the semiconductor body (CP). Moreover, a method is provided for the measurement of a resistance.

15 Claims, 5 Drawing Sheets

SEMICONDUCTOR ARRANGEMENT AND METHOD FOR THE MEASUREMENT OF A RESISTANCE

RELATED APPLICATION

This application claims the priority of German patent application no. 10 2008 014 774.5 filed Mar. 18, 2008, the entire content of which is hereby incorporated by reference.

FIELD OF THE INVENTION

The invention concerns a semiconductor arrangement and a method for the measurement, in particular, of a low resistance between two terminals.

BACKGROUND OF THE INVENTION

In the area of integrated circuits, there is a so-called wafer-level package, also called a chip-scale package, as a new packaging form in which a separate, additional packaging is not used, but rather solder balls are placed directly onto a silicon chip. This special packaging form is particularly space-saving. The measurement of low resistances of components, for example, transistors, in integrated circuits in the wafer-level package is of special importance in ensuring functionality and quality during product testing. To ensure the parameters guaranteed in the data sheet, values must thereby be measured in the order of magnitude of approximately 100 mΩ. This requirement appears frequently in circuits in which large currents flow and small losses are important, for example, in the areas of electricity supply, also called power management, or audio. The contacts which produce the link between the terminals of a component and a measuring device during a product test, for example, needle-shaped probes, as a rule have a far higher contact resistance than does the actual component to be measured. Moreover, it is not the pure resistance of the component in silicon that is important to a user, but rather the total value of the resistance of a terminal of the component to the other terminal. Thus, the parasitic fractions of the packaging, or of the package, have to be taken into consideration. Because of the great variation in these contact resistances caused in production, it is not possible to account for the parasitic fractions with a constant correction. The four-wire measurement usually used, also known as the Kelvin measurement, has serious problems in the area of wafer-level packages as a result of the particularly small contacts.

SUMMARY OF THE INVENTION

One object of the invention is to provide an improved semiconductor arrangement and an improved method with which a measurement, particularly of a low resistance between two connections of a water-level package, is possible.

In one embodiment, a semiconductor arrangement has a semiconductor body, a first and at least one second contact area arranged on the semiconductor body, a first and a second test contact area, a first terminal that can be applied on the semiconductor body, at least one second terminal that can be applied on the semiconductor body, and a first and a second test terminal that can be applied on the semiconductor body. The semiconductor body comprises a semiconductor layer with a first and at least one second conducting terminal area, in each case constructed in two parts, and with a first and a second test terminal area. The first and the at least one second contact area are constructed in two parts and connected with the respective terminal areas. The first test contact area is connected with the first test terminal area. The second test contact area is connected with the second test terminal area. The first terminal contacts both parts of the first contact area constructed in two parts. The at least one second terminal contacts both parts of the at least one second contact area constructed in two parts. The first and the second test terminals are connected with the respective test contact areas.

With the impressing of a measurement current at the first terminal, a closed circuit is brought about between the first and the at least one second terminal via a component to be tested in the semiconductor layer. A dropping voltage between the first and the at least one second terminal is measured at the first and second test terminals. The resistance of the component to be tested is determined as the quotient of the measured voltage and measurement current.

Advantageously, the arrangement makes possible the measurement in particular of a low resistance between the first and the at least one second terminal. By using the test terminals, the problematic contacting of the first and the at least one second terminal with two test probes respectively is advantageously made unnecessary. The arrangement advantageously allows all parasitic contact resistances between the first and the at least one second terminal to be recorded during the measurement.

In another embodiment of the semiconductor arrangement, the first and the at least one second contact areas comprise a smaller area, and a larger area that is insulated electrically from the smaller area.

With the impressing of the measurement current, a current flow is effected via the larger of the contact areas by means of this division of the contact areas. A voltage path is formed via the smaller area of the first and the at least one second contact area. Here, a surface of the respectively larger of the two contact areas is selected large enough that a resistance of this surface and a current density are as low as possible. Since an almost currentless voltage measurement takes place with the arrangement under consideration, the surface area of the smaller of the respective contact areas is selected to be small and is thus somewhat higher-resistance. This arrangement guarantees that an electrical connection between the current-conducting larger area of the respective contact area and the voltage-conducting smaller area of the respective contact area, takes place only via the respective terminal.

With the arrangement, the voltage to be measured between the first and the at least one second terminal is advantageously tapped at the underside of the respective terminal and measured at the first and second test terminals. Thus, the placement of two test probes on each terminal is advantageously made unnecessary.

In one refinement, the semiconductor body comprises a cover layer applied on the semiconductor layer. The cover layer comprises a redistribution layer in which a first and at least one second conducting terminal surface, in each case constructed in two parts, and a first and a second conducting test terminal surface are formed. The function of the redistribution layer is to effect a re-positioning or re-arranging of electrical contacts.

The semiconductor layer and the cover layer can be made as a layer stack. The semiconductor layer comprises, for example, a silicon chip, or wafer, in which at least one electronic component is implemented. The electronic component can be constructed as, for example, a transistor, diode, or an integrated circuit. The contact areas, also called under-bump metallization, and the terminal areas comprise a metal.

The terminal surfaces consist of a conducting material, for example, metal.

In another embodiment, the cover layer has through-connections, so that a first part of the first terminal area is connected with the smaller area of the first contact area via a first part of the first terminal surface; a second part of the first terminal area is connected with the larger area of the first contact area via a second part of the first terminal surface; a first part of the at least one second terminal area is connected with the smaller area of the at least one second contact area via a first part of the at least one second terminal surface; a second part of the at least one second terminal area is connected with the larger area of the at least one second contact area via a second part of the at least one second terminal surface; the first test terminal area is connected with the first test contact area via the first test terminal surface; and the second test terminal area is connected with the second test contact area via the second test terminal surface.

The through-connections can also be designated as redistribution layer vias. They can be made as holes or boreholes that are lined with an electrically conductive material, for example, metal. The cover layer fulfills various functions, for example, a local and an associated electrical redistribution of terminal areas formed in the semiconductor layer by means of the redistribution layer, and/or a protective function with respect to moisture and/or oxidizing substances such as oxygen.

In a refinement, the first and the at least one second terminal area, and the first and the second test terminal area are coated with a conducting material that partially covers the respective terminal area spatially and is designed for the electrical connection with the respective contact area.

The contact surface formed by the conducting material is also designated as a pad. The electrical connection is carried out indirectly from the respective terminal area, via the respective through-connection and the respective terminal surface of the redistribution layer, to the respective contact area.

In another embodiment, the first and the at least one second terminal and the first and the second test terminal are constructed as solder balls with a planarized underside.

The solder balls can also be designated as bumps or soldering bumps. They are characteristic for the packaging form designated as the wafer-level package.

Advantageously, with this arrangement the actual electric potential in the bump material is recorded during the measurement of a resistance. All parasitic contact resistances of the package are taken into consideration. A potential measurement defect is reduced to the voltage drop in the homogeneous metal of the bump, which remains very low or can be estimated with relative accuracy because of the known physical material characteristics and the configuration.

In one refinement, the semiconductor layer has at least one electronic component with at least two contacts, wherein a first contact of the electronic component is connected with the second part of the first terminal area, and a second contact of the electronic component is connected with the second part of the at least one second terminal area.

In another embodiment, the semiconductor layer has a first voltage connection from the first part of the first terminal area to the first test terminal area, and has a second voltage connection from the first part of the at least one second terminal area to the second test terminal area.

The first and the second voltage connection are thereby constructed as electrically conductive connections in the semiconductor layer that is, in the wafer. They enable reading of the voltage to be measured at the underside of the bump of the first and the at least one second terminal, as well as the measurement of the voltage at the first and second test terminals.

Advantageously, the arrangement makes possible the measurement of a resistance even in the later state of the wafer-level package when it is soldered into an application.

In a refinement, the semiconductor layer has a multiplexer component, its first input being coupled with the first part of the first terminal area, its second input being coupled with the first part of the at least one second terminal area, and its output being coupled with the first test terminal area.

The second test terminal is placed at a fixed reference potential. With the impressing of the measurement current, the voltage is first measured at the first test terminal, between the first terminal and the second test terminal. Using the multiplexer component, the voltage is subsequently measured between the at least one second terminal and the second test terminal. The two voltages are subtracted from one another to obtain the voltage between the first and the at least one second terminal. The resistance is determined as described.

In one embodiment, a method for the measurement in particular of a low resistance between two terminals of a wafer-level package comprises the application of a first and a second two-part metal contact area; the application of a first solder ball on the first contact area for the formation of a first terminal and a second solder ball on the second contact area for the formation of a second terminal; the impressing of a measurement current at the first terminal; the reading of a voltage between a first test terminal and a second test terminal; and the determination of a resistance between the first and the second terminals as a quotient of the read voltage and the measurement current. The first and the second two-part contact areas are placed on a semiconductor body that comprises a semiconductor layer with at least one electronic component to be tested. The impressing of the measurement current at the first terminal brings about the formation of a closed circuit via the semiconductor body and the second terminal. The first test terminal is connected with the first terminal via the semiconductor body. The second test terminal is connected with the second terminal via the semiconductor body.

Advantageously, the resistance between the first and the second terminals, including all parasitic contact resistances, is measured with the method. Every terminal and every test terminal is advantageously contacted by just one test probe. A usually necessary contacting of each terminal by two test probes, in which the current is conducted at one test probe and the voltage is read at the second test probe, is unnecessary.

The component to be tested can feature, for example, a diode, a transistor, or an integrated circuit.

In one refinement, the application of the first and the second two-part metal contact areas is carried out in such a way that the first and the second contact areas are divided into a smaller and a larger area that are electrically insulated from one another.

In another embodiment, the application of the first and the second two-part metal contact areas is carried out on a first and a second two-part terminal surface of a cover layer incorporated in the semiconductor body and located on the semiconductor layer.

In one refinement, the impressing of the measurement current effects a current flow through the solder balls of the first terminal, via the larger area of the first contact area, via the electronic component of the semiconductor body to be tested, to the larger area of the second contact area and to the solder ball of the second terminal.

In another embodiment, the impressing of the measurement current brings about the formation of a first voltage path from an underside of the solder ball of the first terminal, via the smaller area of the first contact area, via the semiconductor body, to the first test terminal, and the formation of a second voltage path from an underside of the solder ball of the second terminal, via the smaller area of the second contact area, via the semiconductor body, to the second test terminal.

The formation of the first and the second voltage path makes it advantageously possible to read the voltage between the first and the second terminal at the first and at the second test terminal. Thus it is advantageously possible to contact the first and the second terminals with only one test probe, as well as to contact the first and the second test terminals. Due to the configuration of the contact areas and the separation of the current flow and voltage paths caused thereby, the voltage measurement is carried out almost current-free. Therefore, low resistances, for example, in the vicinity of 100 mΩ, can also be advantageously measured.

In one refinement, the reading of the voltage is carried out as the reading of a first partial voltage between the first terminal and the second test terminal; as the reading of a second partial voltage between the first terminal and the second test terminal; and the voltage is determined as a difference of the first and second partial voltages.

The first test terminal is placed at a fixed reference potential. The first partial voltage is therefore the voltage between the first terminal and the reference potential; the second partial voltage is the voltage between the second terminal and the reference potential.

Advantageously, only one test terminal is needed for this. Nevertheless, the resistance between the first and the second terminal, including all parasitic contact resistances that appear in the semiconductor body, are advantageously recorded.

BRIEF DESCRIPTION OF THE DRAWINGS

Embodiments of the invention are explained in more detail below, with the aid of figures. Elements similar in function or effect have the same reference symbols. If components correspond in their function, their description is not repeated in each of the subsequent figures. The figures show the following.

DETAILED DESCRIPTION OF THE DRAWINGS

Figure 1:
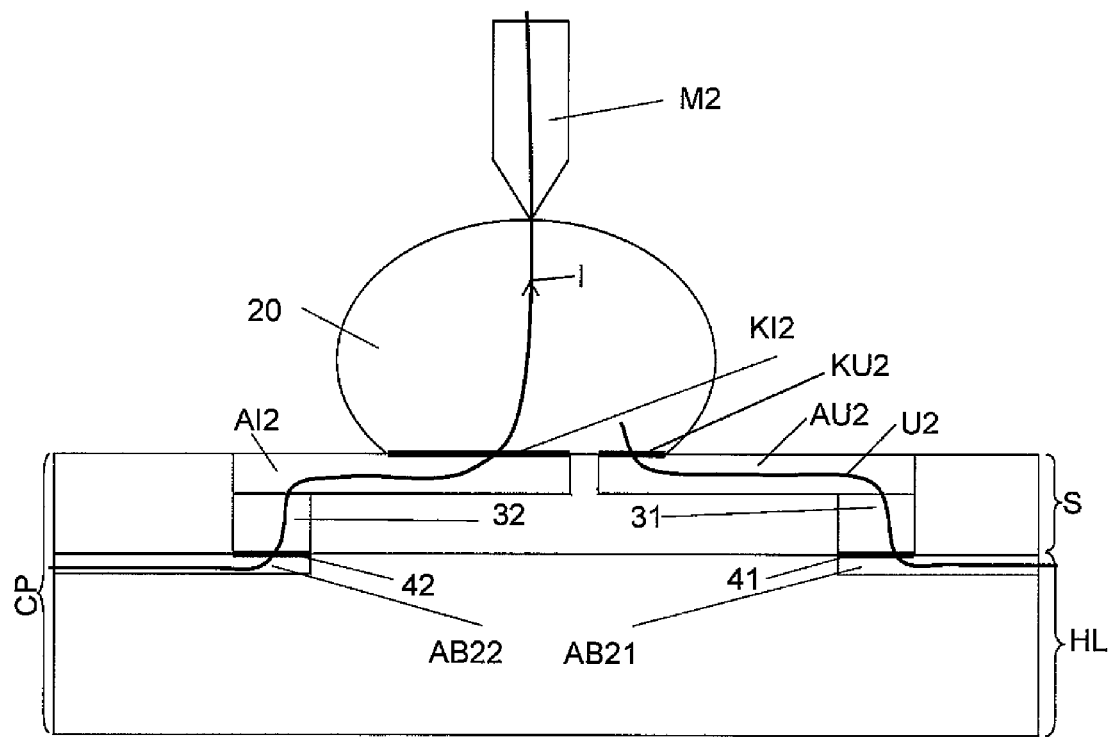
FIG. 1, an embodiment example of a semiconductor arrangement according to the invention, in a side view.

FIG. 1 shows an embodiment example of a semiconductor arrangement according to the invention, in a side view. A semiconductor body CP is depicted with a terminal 20 arranged on it and a test probe M2 to be placed on it. The semiconductor body CP is constructed as a layer stack and comprises a semiconductor layer HL and a cover layer S. The terminal 20 is formed as a solder ball. The needle-shaped test probe M2 can also be referred to as a probing pin. The semiconductor body CP comprises, as described, a wafer in which at least one electronic component, for example, a transistor, a diode, or an integrated circuit, is implemented. For electrical contact with the cover layer S lying above it, the semiconductor layer HL has a two-part terminal area AB22, AB21 at the top. Both the first part AB21 and the second part AB22 of the two-part terminal area have a metal layer. The first and the second parts AB21 and AB22 of the two-part terminal area are, as depicted, covered with a first pad 41 and a second pad 42. The cover layer S is located on the semiconductor layer HL. The cover layer S has a first and a second through-connection 31 and 32, a two-part terminal surface AI2, AU2, and a two-part contact area KI2, KU2. The first part of the terminal area AB21 is connected via the first pad 41 and the first through-connection 31 with the first part AU2 of the terminal surface. The first part AU2 of the terminal surface is connected in an electrically conductive manner with the terminal 20 via a smaller area KU2 of the two-part contact area. The second part AB22 of the terminal area is connected, via the second pad 42 and the second through-connection 32, with the second part AI2 of the terminal surface. The second part of the terminal surface AI2 is connected in an electrically conductive manner with the terminal 20 via a larger area KI2 of the two-part contact area. The smaller area KU2 and the larger area KI2 of the two-part contact area are electrically insulated from one another.

An application of a measurement current I brings about a current flow through the terminal 20. Due to the different sizes of the contact areas KI2 and KU2, the measurement current I preferentially flows via the larger contact area KI2, which has a smaller resistance as a result of the larger surface area. The current flows via the second part of the terminal surface AI2, via the second through-connection 32 and the second pad 42, to the terminal area AB22 in the semiconductor layer HL. At the same time, a voltage path U2 is formed. This leads from the underside of the terminal 20, via the smaller area of the contact area KU2, via the terminal surface AU2, via the first through-connection 31 and the first pad 41, to the terminal area AB21 in the semiconductor layer HL.

Advantageously, the measurement current I flows through all boundary layers between the different layers of the semiconductor body CP. In a resistance measurement, all the parasitic resistances that appear are recorded. Thus, the characteristics specified in a data sheet of a component can be advantageously tested and assured in the form relevant for a user, namely, from terminal to terminal.

Figure 2:
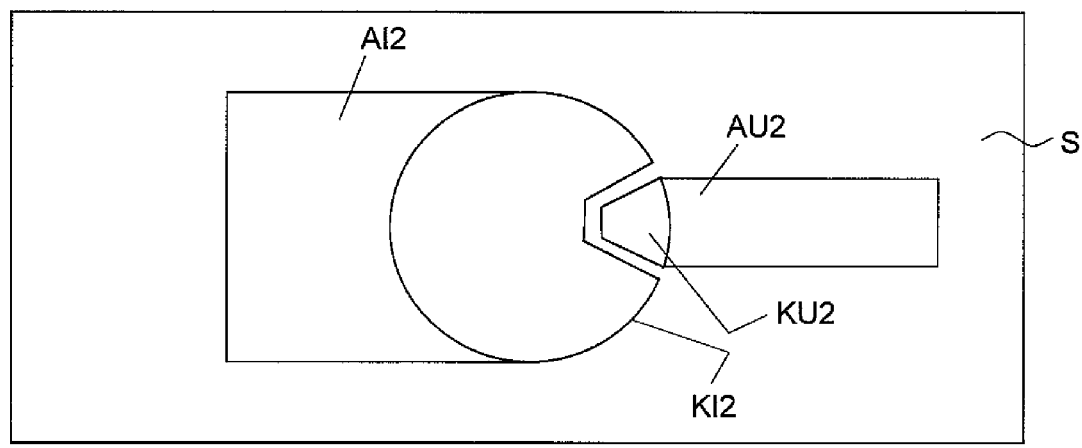
FIG. 2, the semiconductor arrangement of FIG. 1 in top view.

FIG. 2 shows the semiconductor arrangement of FIG. 1 in top view. The terminal 20, formed as a solder ball, and the test probe M2 are not depicted here. Thus, the first part of the terminal surface AU2 and the second part of the terminal surface AI2 can be seen on the cover layer S. The smaller area KU2 of the contact area is depicted on the first part of the terminal surface AU2. This is made here, for example, approximately as a circular segment, which is insulated from the larger area KI2 via the cover layer S. The larger area KI2 of the contact area is located on the second part AI2 of the terminal surface. This is approximately depicted here, for example, as a circle with a cut-out segment, namely the smaller contact area KU2.

The depicted embodiment of the two-part contact area with the larger area KI2 and the smaller area KU2 makes possible a current flow of the measurement current I via the larger area KI2, and a reading of a voltage at the smaller area KU2 of the contact area. The contact area KU2 can thereby be made very small, and does not require strong protection from electrostatic discharges, since when an electrostatic pulse appears at the terminal 20, the energy is advantageously diverted via the well-protected current path.

Figure 3A:
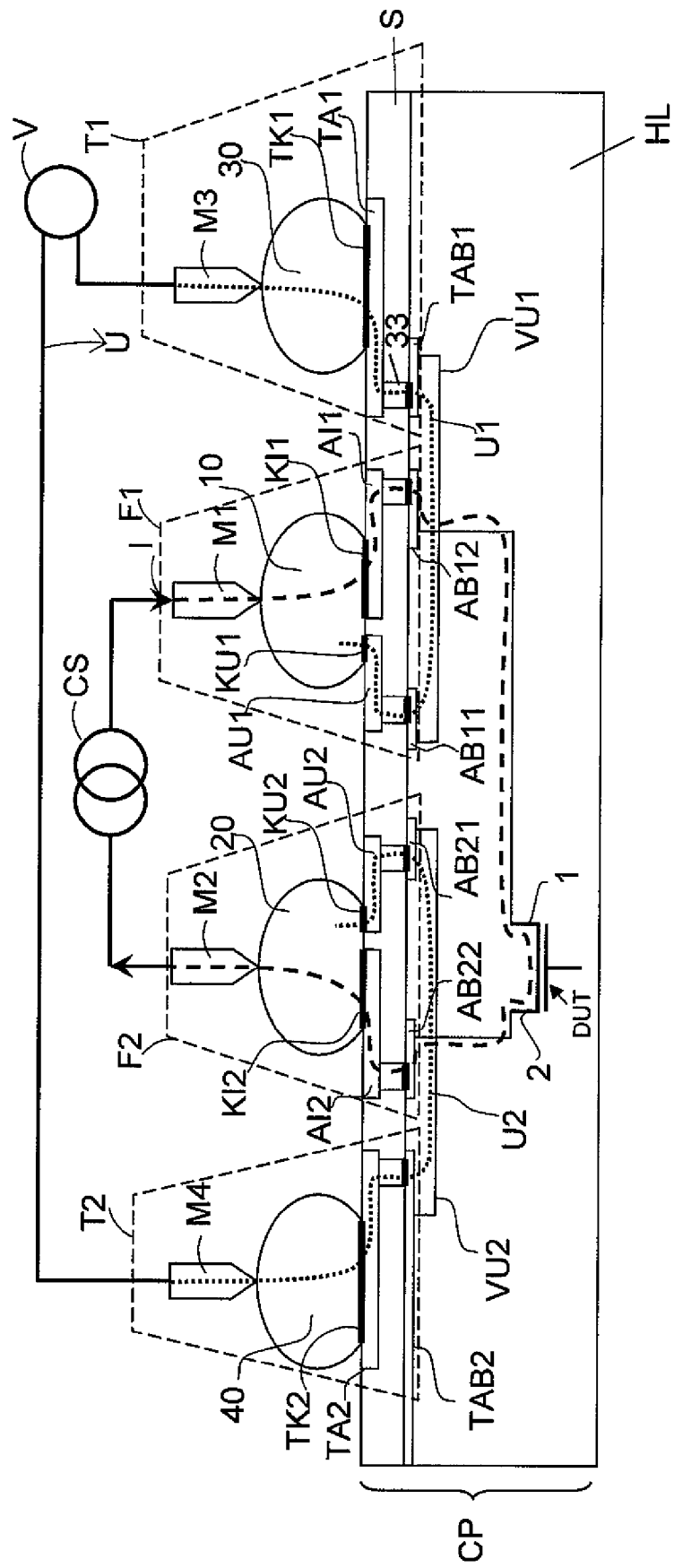
FIG. 3A, an embodiment example of a semiconductor arrangement with measurement of a resistance.

FIG. 3A shows an embodiment example of a semiconductor arrangement with the measurement of a resistance. The semiconductor arrangement comprises the arrangement F2, depicted in FIG. 1, another arrangement F1, a first and a second test apparatus T1 and T2, and a current source CS to make available the measurement current I and a measuring device V to measure a voltage U. The arrangement F1 corresponds in its structure and its function to the arrangement F2 of FIG. 1, but is depicted as a vertical reflection. The arrangement F1 thus implements a first terminal 10 on which a test probe M1 is placed. The arrangement F1 moreover comprises a two-part contact area KI1, KU1, a two-part terminal surface AI1, AU1, and a two-part terminal area AB11, AB12. The different layers are connected among one another as depicted for the arrangement F2 in FIG. 1. The first test apparatus T1 comprises a test probe M3, a first test terminal 30, a first test contact area TK1, a first test terminal surface TA1, and a first test terminal area TAB1. The first test terminal area TAB1 is connected with the first test terminal surface TA1 in an electrically conductive manner via a through-connection 33. The first test terminal surface TA1 is connected with the first test terminal 30, constructed as a solder ball, in an electrically conductive manner via the first test contact area TK1. The second test apparatus T2 is constructed just like the first test apparatus T1. It comprises a test probe M4, a second test terminal 40, a second test contact area TK2, a second test terminal surface TA2, and a second test terminal area TAB2.

The semiconductor body CP has a first voltage connection VU1, a second voltage connection VU2, and an electronic component DUT to be tested in the semiconductor layer HL. The first voltage connection VU1 connects the first part of the first terminal area AB11 with the first test terminal area TAB1. The second voltage connection VU2 connects the first part of the second terminal area AB21 with the second test terminal area TAB2. Here, the electronic component DUT to be tested is constructed as a transistor by way of example. A first terminal 1 of the component DUT is connected with the second part of the first terminal area AB12. A second terminal 2 of the component DUT is connected with the second part of the second terminal area AB22.

The measurement current I is impressed at the first terminal 10 at the test probe M1. A closed circuit, depicted with a broken line, is formed via the larger area of the first contact area KI1, the second part of the first terminal surface AI1, the second part of the first terminal area AB12, via the first terminal 1 of the electronic component DUT to the second terminal 2 of the electronic component DUT, and continues on via the second part of the second terminal area AB22 to the second part of the second terminal surface AI2, to the larger area of the second contact area KI2, to the second terminal 20. At the same time, a first voltage path U1 and a second voltage path U2 are formed, which are depicted with dotted lines. The first voltage path U1 leads from the underside of the first terminal 10 via the smaller area of the first contact area KU1, via the first part of the first terminal surface AU1, via the first part of the first terminal AB11, via the voltage connection VU1, to the first test terminal area TAB1, and continues on via the first test terminal surface TA1 to the first test contact area TK1, and thus to the first test terminal 30. The second voltage path U2 leads from the underside of the second terminal 20 via the first part of the second contact area KU2, via the first part of the second terminal surface AU2, via the first part of the second terminal area AB21, via the second voltage connection VU2, to the second test terminal area TAB2, and continues on to the second test terminal surface TA2, to the second test contact area TK2, and thus to the second test terminal 40. The voltage U is measured with the test probes M3 and M4 at the first test terminal 30 and at the second test terminal 40. A resistance of the electronic component DUT is determined as a quotient of the voltage U and the measurement current I.

Advantageously, the first terminal 10 and the second terminal 20, as well as the first test terminal 30 and the second test terminal 40, are each contacted with only one test probe. Nevertheless, this is a real four-wire measurement, and the resistance of the electronic component DUT can be determined directly.

In another embodiment, the two test terminals 30 and 40 can be placed at various measurement points to measure the resistances of other components via analogous multiplexers. The test terminals 30 and 40 need not be exclusively reserved for the testing, but rather can take over other functions in the normal operation of the integrated circuit implemented in the semiconductor body CP.

Figure 3B:
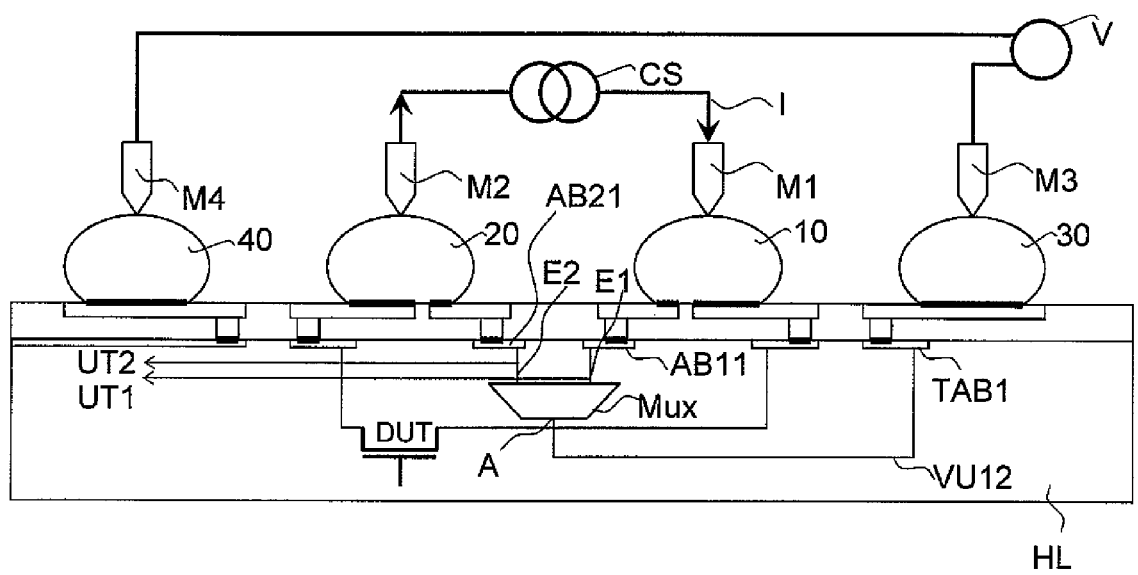
FIG. 3B, an embodiment example of a semiconductor arrangement with sequential measurement of a resistance.

FIG. 3B shows an embodiment example of a semiconductor arrangement with sequential measurement of a resistance. The depicted arrangement corresponds in its structure to the arrangement depicted in FIG. 3A, with changed voltage connections. The semiconductor layer HL also has a multiplexer component MUX. A first input E1 of the multiplexer component MUX is connected with the first part of the first terminal area AB11. A second input E2 of the multiplexer component MUX is connected with the first part of the second terminal area AB21. An output A of the multiplexer element MUX is connected with the first test terminal area TAB1 via a voltage connection VU12.

The measurement current I is again impressed at the first terminal 10 via the test probe M1. A closed current circuit is formed from the first terminal 10, via the electronic component DUT, to the second terminal 20. The measurement current I flows via the test probe M2 back to the current source A constant reference potential is applied to the second test terminal 40. A first partial voltage UT1 is first read off between the first test terminal 30 and the second test terminal 40. This corresponds to a voltage between the first input E1 of the multiplexer component MUX and the second test terminal 40. Subsequently, using the multiplexer component MUX, a second partial voltage UT2 is read off with the test probes M3 and M4. The partial voltage UT2 drops between the second input E2 of the multiplexer component MUX, that is, the second terminal 20, and the second test terminal 40. The voltage U between the first and the second terminals 10 and 20 is calculated as the difference between the two partial voltages UT1 and UT2.

Figure 4:
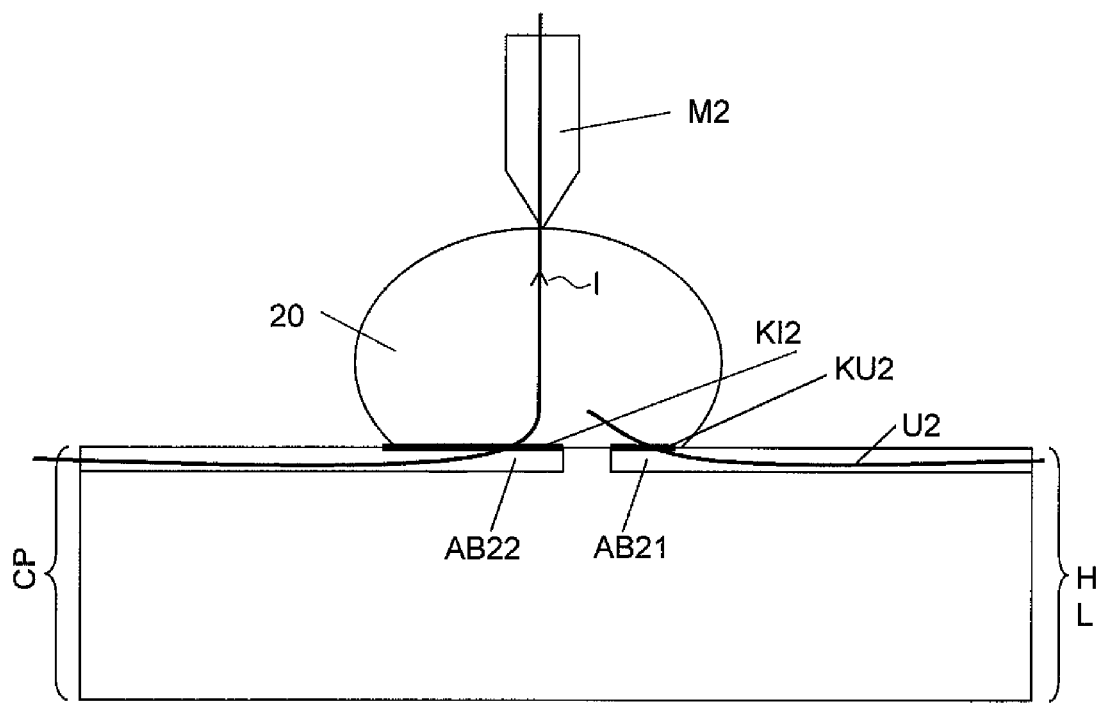
FIG. 4, an embodiment example of a semiconductor arrangement without a cover layer, in a side view.

FIG. 4 shows an embodiment example of a semiconductor arrangement without a cover layer S, in a side view. The semiconductor body CP here comprises only the semiconductor layer HL. In contrast to the arrangement of FIG. 1, a redistribution, or repositioning, of the terminals is not required in this arrangement. Consequently, the smaller area KU2 of the second contact area is directly connected with the first part of the second terminal area AB21; the larger area of the second contact area KI2 is directly connected with the second part of the second terminal area AB22. The impressed measurement current I flows, via the larger area KI2 of the second contact area directly to the second part of the second terminal area AB22. At the same time, the second voltage path U2 is formed from the underside of the second terminal 20, via the smaller area KU2 of the second contact area, to the first part of the second terminal area AB21.

Figure 5:
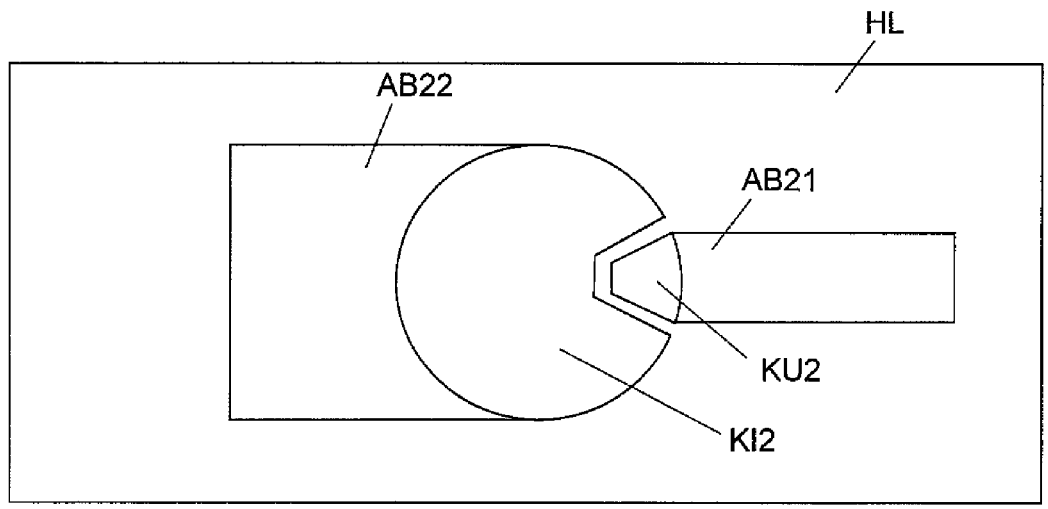
FIG. 5, the semiconductor arrangement of FIG. 4 in top view.

FIG. 5 shows the semiconductor arrangement of FIG. 4 in a top view. Analogous to FIG. 2, the terminal 20 formed as a solder ball and the test probe M2 are not depicted here. The first part of the second terminal surface AB21 and the second part of the terminal surface AB22 are depicted on the semiconductor body HL. The smaller area KU2 of the second contact area can be seen on the first part of the second terminal surface AB21. The larger area KI2 of the second contact area can be seen on the second part of the second terminal area AB22. The contact areas KI2 and KU2 are formed as described for FIG. 2, and are insulated from one another.

Figure 6:
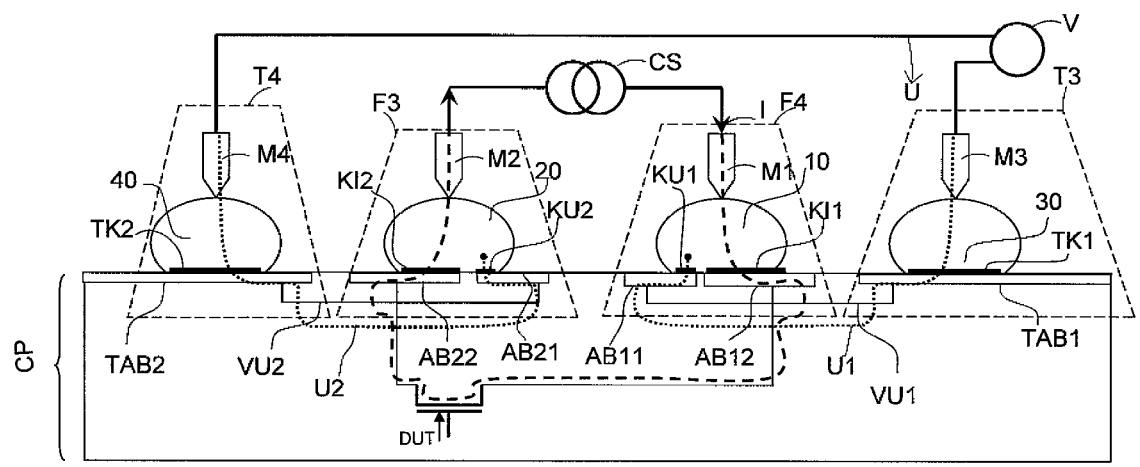
FIG. 6, an embodiment example of a semiconductor arrangement without cover layer with measurement of a resistance.

FIG. 6 shows an embodiment example of a semiconductor arrangement without a cover layer S, with the measurement of a resistance. The semiconductor arrangement comprises the arrangement F3 depicted in FIG. 4, another arrangement F4, a third and a fourth test apparatus T3 and T4, the current source CS to make available the measurement current I and the measuring device V to measure the voltage U corresponding to FIG. 3A. The arrangement F4 corresponds, in its structure and in its function, to the arrangement F3 depicted in FIG. 4, but is depicted as a vertical reflection. The arrangement F4 thus implements the first terminal 10, on which the test probe M1 is set. The arrangement F3 implements the second terminal 20. The third test apparatus T3 comprises the test probe M3, the first test terminal 30, the first test contact area TK1, and the first test terminal area TAB1. The first test contact area TK1 is directly connected with the first test terminal area TAB1. The fourth test apparatus T4 is constructed analogously to the third test apparatus T3 and comprises the test probe M4, the second test terminal 40, the second test contact area TK2, and the second test terminal area TAB2. Here too, the second test contact area TK2 is directly connected with the second test terminal area TAB2.

The impressing of the measurement current I at the test probe M1 brings about a current flow from the first terminal 10, via the larger area KI1 of the first contact area, the second part of the first terminal area AB12, via the component DUT to be tested, to the second part of the second terminal area AB22, to the larger area KI2 of the second contact area, to the second terminal 20 and to the test probe M2. At the same time, the first voltage path U1 and the second voltage path U2 are formed. Analogously to the depiction for FIG. 3A, but without cover layer S, the first voltage path U1 runs from the underside of the first terminal 10 via the smaller area KU1 of the first contact area, via the first part of the first terminal area AB11, via the first voltage connection VU1, to the first test terminal area TAB1, and continues on via the first test contact area TK1, the first test terminal 30, and the test probe M3 to the voltage measuring device. The second voltage path U2 runs from the underside of the second terminal 20 via the smaller area KU2 of the second terminal area AB21, via the second voltage connection VU2, to the second test terminal area TAB2, and continues on via the second test contact area TK2, the second test terminal 40, and the test probe M4 to the voltage measuring device. The determination of the resistance is carried out as described for FIG. 3A.

Advantageously, with the arrangement shown, all contact resistances are recorded with the resistance measurement, in particular, the contact resistances between the two-part terminal areas AB11, AB12, and AB21, AB22, on the wafer and the respective solder ball of the first and second terminals 10 and 20.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A semiconductor arrangement comprising:
   a semiconductor body having a semiconductor layer with a first and at least one second conducting terminal areas, each formed in two parts, and with first and second test terminal areas;
   first and at least one second contact areas, located on the semiconductor body and each formed in two parts, a first part of the first conducting terminal area being connected with a first part of the first contact area, a second part of the first conducting terminal area being connected with a second part of the first contact area, a first part of the at least one second conducting terminal area being connected with a first part of the at least one second contact area, a second part of the at least one second conducting terminal area being connected with a second part of the at least one second contact area, and a first and a second test contact area connected with the respective first and second test terminal areas;
   a first terminal, arranged on the semiconductor body in contact with both parts of the first contact area formed in two parts, and at least one second terminal arranged on the semiconductor body in contact with both parts of the at least one second contact area formed in two parts; and
   first and second test terminals, arranged on the semiconductor body, the first test terminal being connected with the first test contact area and the second test terminal being connected with the second test contact area;
   wherein the semiconductor arrangement is configured to measure a low resistance between the first terminal and the at least one second terminal.

2. The semiconductor arrangement according to claim 1, wherein the first and the at least one second contact areas respectively comprise a smaller area and a larger area, wherein the larger area is electrically insulated from the smaller area.

3. The semiconductor arrangement according to claim 2, wherein the semiconductor body has a cover layer, located on the semiconductor layer, comprising a redistribution layer in which a first and at least one second conducting terminal surface, respectively constituted as two parts, and a first and a second conducting test terminal surfaces are formed.

4. The semiconductor arrangement according to claim 3, wherein the cover layer has through-connections so that
   a first part of the first terminal area is connected with the smaller area of the first contact area via a first part of the first terminal surface;
   a second part of the first terminal area is connected with the larger area of the first contact area via a second part of the terminal surface;
   a first part of the at least one second terminal area is connected with the smaller area of the at least one second contact area via a first part of the at least one second terminal surface;
   a second part of the at least one second terminal area is connected with the larger area of the at least one second contact area via a second part of the at least one second terminal surface;
   the first test terminal area is connected with the first test contact area via the first test terminal surface; and
   the second test terminal area is connected with the second test contact area via the second test terminal surface.

5. The semiconductor arrangement according to claim 4, wherein the semiconductor layer has at least one electronic component with at least two contacts, the first contact of which is connected with the second part of the first terminal area, and the second contact of which is connected with the second part of the at least one second terminal area.

6. The semiconductor arrangement according to claim 4, wherein the semiconductor layer has a first voltage connection from the first part of the first terminal area to the first test terminal area, and a second voltage connection from the first part of the at least one second terminal area to the second test terminal area.

7. The semiconductor arrangement according to claim 4, wherein the semiconductor layer has a multiplexer component with a first input that is coupled with the first part of the first terminal area, a second input that is coupled with the first part of the at least one second terminal area, and an output that is coupled with the first test terminal area.

8. The semiconductor arrangement according to claim 1, wherein the first and the at least one second terminal areas, and the first and the second test terminal areas are covered with a conducting material that partially covers the respective terminal areas spatially and is designed for electrical connection with the respective contact areas.

9. The semiconductor arrangement according to claim 1, wherein the first and the at least one second terminals, as well as the first and the second test terminals are respectively made as solder balls with a planarized underside.

10. A method for the measurement of a low resistance between two terminals of a wafer-level package, comprising the steps of:
applying a first and a second two-part metal contact areas onto a semiconductor body comprising a semiconductor layer having at least one component to be tested;
applying a first solder ball onto the first contact area for the formation of a first terminal that contacts both parts of the first contact area, and applying a second solder ball onto the second contact area for the formation of a second terminal that contacts both parts of the second contact area;
injecting a measurement current at the first terminal and forming a closed current circuit via the semiconductor body and the second terminal;
reading a voltage between a first test terminal, which is connected with the first terminal via the semiconductor body, and a second test terminal, which is connected with the second terminal via the semiconductor body; and
determining a resistance between the first and the second terminals as a quotient of the read-off voltage and the measurement current.

11. The method according to claim 10, wherein the step of applying the first and the second contact areas is carried out so that the first and the second contact areas are divided into a smaller area and a larger area, which are electrically separated from one another.

12. The method according to claim 11, wherein the step of applying the first and the second two-part metal contact areas takes place on a first and a second two-part terminal surface of a cover layer incorporated in the semiconductor body and located on the semiconductor layer.

13. The method according to claim 11, wherein the step of injecting the measurement current creates a current flow through the solder ball of the first terminal via the larger area of the first contact area, via the electronic component of the semiconductor body to be tested, to the larger area of the second contact area and the solder ball of the second terminal.

14. The method according to claim 11, wherein the step of injecting the measurement current forms a first voltage path from an underside of the solder ball of the first terminal via the smaller area of the first contact area, via the semiconductor body, to the first test terminal, and a second voltage path from an underside of the solder ball of the second terminal via the smaller area of the second contact area, via the semiconductor body, to the second test terminal.

15. The method according to claim 10, wherein the step of reading of the voltage is carried out as reading of a first partial voltage between the first terminal and the second test terminal, reading of a second partial voltage between the second terminal and the second test terminal, and determining the voltage as the difference between the first and second partial voltages.

* * * * *